(12) United States Patent
Li et al.

(10) Patent No.: US 10,962,832 B2
(45) Date of Patent: Mar. 30, 2021

(54) DISPLAY DEVICE AND METHOD FOR FABRICATING THE SAME

(71) Applicant: BOE TECHNOLOGY GROUP CO., LTD., Beijing (CN)

(72) Inventors: Dongsheng Li, Beijing (CN); Huili Wu, Beijing (CN); Jifeng Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 21 days.

(21) Appl. No.: 16/337,736

(22) PCT Filed: May 11, 2018

(86) PCT No.: PCT/CN2018/086480
§ 371 (c)(1),
(2) Date: Mar. 28, 2019

(87) PCT Pub. No.: WO2018/205992
PCT Pub. Date: Nov. 15, 2018

(65) Prior Publication Data
US 2019/0346719 A1 Nov. 14, 2019

(30) Foreign Application Priority Data

May 12, 2017 (CN) .......................... 201710334793.4

(51) Int. Cl.
*G02F 1/13357* (2006.01)
*G02F 1/29* (2006.01)
*H01L 51/52* (2006.01)

(52) U.S. Cl.
CPC .. *G02F 1/133606* (2013.01); *G02F 1/133603* (2013.01); *G02F 1/29* (2013.01);
(Continued)

(58) Field of Classification Search
None
See application file for complete search history.

(56) References Cited

U.S. PATENT DOCUMENTS

2008/0043475 A1* 2/2008 Bernkopf ............ H01L 51/5262
362/326
2011/0285942 A1* 11/2011 Guo .................. G02F 1/133516
349/96

(Continued)

FOREIGN PATENT DOCUMENTS

| CN | 105374918 | 3/2016 |
| CN | 105374919 | 3/2016 |

(Continued)

OTHER PUBLICATIONS

Cai et al. "Optical cloaking with metamaterials" Nature Photonics, 1:224-228 (2007).

(Continued)

*Primary Examiner* — Edward J Glick
*Assistant Examiner* — David Y Chung
(74) *Attorney, Agent, or Firm* — Myers Bigel, P.A.

(57) ABSTRACT

A display device is disclosed. The display device includes display unit and a negative refractive index functional layer on the display unit. The negative refractive index functional layer has a negative refractive index with respect to light from the display unit. A method for fabricating the display device is also disclosed.

7 Claims, 2 Drawing Sheets

(52) U.S. Cl.
CPC .............. *H01L 51/5275* (2013.01); *G02F 2001/133607* (2013.01); *G02F 2001/294* (2013.01)

(56) References Cited

U.S. PATENT DOCUMENTS

| | | | |
|---|---|---|---|
| 2013/0050409 A1 | 2/2013 | Li et al. | |
| 2014/0110672 A1* | 4/2014 | Hack | H01L 27/3223 257/40 |
| 2015/0085347 A1* | 3/2015 | Choi | G02B 1/002 359/326 |
| 2015/0146116 A1* | 5/2015 | Liao | G02B 30/27 349/15 |
| 2015/0168776 A1* | 6/2015 | Song | H01L 27/326 349/62 |
| 2016/0061993 A1 | 3/2016 | Ren et al. | |
| 2016/0064612 A1 | 3/2016 | Ren et al. | |
| 2017/0255015 A1* | 9/2017 | Geng | G02B 6/08 |

FOREIGN PATENT DOCUMENTS

| | | |
|---|---|---|
| CN | 105929600 | 9/2016 |
| CN | 106324906 | 1/2017 |
| CN | 106932954 | 7/2017 |
| JP | H0815687 | 1/1996 |
| TW | 201104372 | 2/2011 |

OTHER PUBLICATIONS

Dolling et al. "Negative-index metamaterial at 780 nm wavelength" Optics Letters, 32(1):53-55 (2007).
Pendry et al. "Extremely Low Frequency Plasmons in Metallic Mesostructures" Physical Review Letters, 76(25):4773-4776 (1996).
Smith et al. "Composite Medium with Simultaneously Negative Permeability and Permittivity" Physical Review Letters, 84(18):4184-4187(2000).
Enkrich et al. "Magnetic Metamaterials at Telecommunication and Visible Frequencies" Physical Review Letters, 95: 203901 (2005).
Chinese Office Action corresponding to CN Application No. 201710334793.4, dated May 30, 2019 (15 pages to include English translation).
International Search Report and Written Opinion corresponding to International Application No. PCT/CN2018/086480, dated Jul. 18, 2018 (13 pages to include English translation of Written Opinion).

\* cited by examiner

DISPLAY DEVICE AND METHOD FOR FABRICATING THE SAME

CROSS REFERENCE TO RELATED APPLICATIONS

The present application is a 35 U.S.C. 371 national stage application of PCT International Application No. PCT/CN2018/086480, filed on May 11, 2018, which claims the benefit of Chinese Patent Application No. 201710334793, filed on May 12, 2017, the contents of which are incorporated herein by reference in their entireties. The above-referenced International Application was published in the Chinese language as International Publication No. WO 2018/205992, published on Nov. 15, 2018.

TECHNICAL FIELD

The present disclosure relates to the field of display technologies, and particularly to a display device and a method for fabricating the same.

BACKGROUND

A liquid crystal display device has been widely applied due to its advantages like light weight, small size, radiationless. Since the liquid crystal does not emit light by itself, the display device is provided with a backlight unit, which provides light for a display module to realize the display function. The low utilization efficiency of light in the backlight unit is one of the important factors which impede a low power consumption of the liquid crystal display device.

SUMMARY

An embodiment of the present disclosure provides a display device. The display device comprises a display unit and a negative refractive index functional layer on the display unit. The negative refractive index functional layer has a negative refractive index with respect to light from the display unit.

In an embodiment of the present disclosure, the display device comprises a display region and a light transmitting region, the display unit is a liquid crystal display unit or an organic light emitting diode, and the display unit is in the display region.

In an embodiment of the present disclosure, the negative refractive index functional layer comprises a negative refractive index portion, and the negative refractive index portion is in the display region.

In an embodiment of the present disclosure, the negative refractive index functional layer further comprises a transparent material portion, and the transparent material portion is at least arranged in the light transmitting region.

In an embodiment of the present disclosure, the transparent material portion is further in the display region, and covers the negative refractive index portion.

In an embodiment of the present disclosure, the negative refractive index portion has a negative refractive index with respect to visible light.

In an embodiment of the present disclosure, the negative refractive index portion has a negative refractive index with respect to red light, green light and blue light.

In an embodiment of the present disclosure, the negative refractive index portion is a two-dimensional periodic structure comprising metal strips and a metal split ring resonator.

In an embodiment of the present disclosure, the negative refractive index portion is a nano-grid of a stack comprising a metal, dielectric and a metal.

In an embodiment of the present disclosure, the metal is silver, and the dielectric is magnesium fluoride.

In an embodiment of the present disclosure, the negative refractive index portion comprises a dielectric matrix and metal strips which are distributed radially in the dielectric matrix.

In an embodiment of the present disclosure, the display device further comprises a light converging unit on the negative refractive index functional layer.

In an embodiment of the present disclosure, the light converging unit comprises two liquid crystal prism layers which are stacked on the negative refractive index functional layer in this order.

In an embodiment of the present disclosure, each of the liquid crystal prism layers comprises a liquid crystal prism in the display region.

An embodiment of the present disclosure provides a method for fabricating a display device. The method comprises: prepare display unit; and forming a negative refractive index functional layer on the display unit, wherein the negative refractive index functional layer has a negative refractive index with respect to light from the display unit.

BRIEF DESCRIPTION OF THE DRAWINGS

In order to explain the technical solutions in the embodiments of the present disclosure more clearly, the drawings to be used in the description of the embodiments will be introduced briefly in the following. Apparently, the drawings described below are only some embodiments of the present disclosure, a person with ordinary skill in the art, on the premise of not paying any creative work, can also obtain other drawings from these drawings.

Specific embodiments of the present disclosure have been shown in these drawings, and will be described in detail hereinafter. These drawings and verbal description do not intend to make limitations to the scope of the present disclosure, but to elucidate the concept of the present disclosure for the person with ordinary skill in the art by referring to specific embodiments.

DETAILED DESCRIPTION OF EMBODIMENTS

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

In order to improve the utilization efficiency of light in the backlight unit, optical sheets such as a brightness enhancement film (BEF) or a dual brightness enhancement film (DBEF) are attached between the backlight unit and the display module. BEF is also called a prism sheet. A surface of BEF comprises prismatic structures of an identical structure which reflect and refract light from the backlight unit to a front side of a viewer of the display device. DBEF is also called a reflective polarizer. DBEF adopts a film system comprising several layers, which reflect light with a polarization direction perpendicular to the polarization direction of a lower polarizer of the display module back to the backlight unit. The reflected light are refracted and reflected several times in the backlight unit, and the vibration direction for a portion of light is parallel to the polarization direction of the lower polarizer. This portion of light enters the liquid crystal layer again through the lower polarizer, which thus improves the brightness of the display device.

However, the process for BEF and DBEF is very complicated, and patents for this are possessed by a few giants in the industry, so that the price is high.

Embodiments of the present disclosure provide a display device and a method for fabricating the same, which intend to overcome the drawbacks of complicated process and high price of the optical sheet as described above, and improve the utilization efficiency of light of the backlight unit in the display device.

The display device and the method for fabricating the same according to embodiments of the present disclosure will be described hereinafter by referring to the accompanying drawings.

Figure 1:
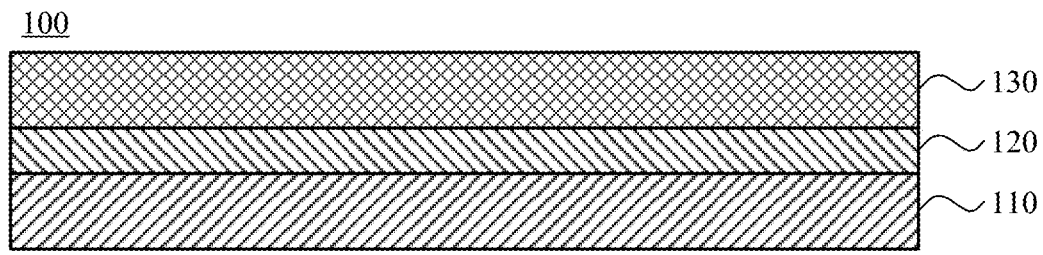
FIG. 1 is a structural view for schematically illustrating a display device in an embodiment of the present disclosure.

An embodiment of the present disclosure provides a display device. As shown in FIG. 1, a display device 100 comprises a display unit 110 and a negative refractive index functional layer 120 which is arranged on the display unit 110. The negative refractive index functional layer 120 has a negative refractive index with respect to light from the display unit 110. Optionally, the display device 100 further comprises a light converging unit 130 which is arranged on the negative refractive index functional layer 120.

Figure 2:
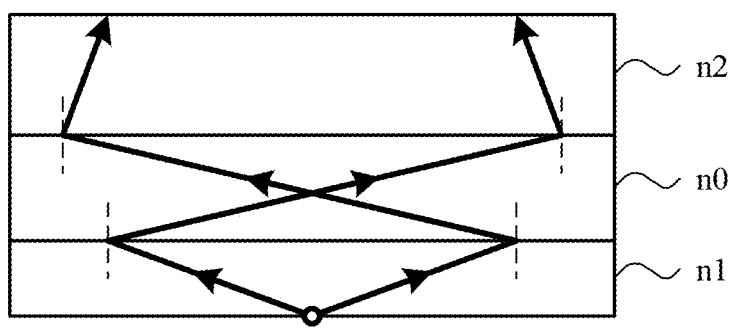
FIG. 2 is a view for schematically illustrating a light path of light which travels through a stack consisting of a positive refractive index material and a negative refractive index material.

FIG. 2 is a view which schematically shows the effect of the negative refractive index functional layer on the light propagation. The negative refractive index material layer (as shown by n0 in FIG. 2) has the following optical characteristic. When light is propagated in the negative refractive index material layer, the propagation direction of energy is opposite to that of phase. In case light is propagated from a material layer with a positive refractive index (as shown by n1 in FIG. 2) to a material layer with a negative refractive index, the incident light and the refracted light are located at a same side of the normal, so that the propagation direction of light is changed. The normal of an interface between two neighboring layers is shown by a dashed line in FIG. 2. As shown in FIG. 2, when the incident light is incident from n1 onto the interface between n1 and n0, the reflected light (not shown) is located at another side of the normal, while the refracted light is located at a same side of the normal as the incident light. A positive refractive index material layer n2 is also shown in the figure, which is stacked on the negative refractive index material layer n0. Similarly, when the light is incident onto an interface between n0 and n2, the refracted light is still located at a same side of the normal as the incident light. It is noted that although the refraction direction of light at the interface between the negative refractive index material layer and positive refractive index material layer does not follow Snell law, but the refraction angle still follows Snell law.

As can be seen from the light path of FIG. 2, by arranging the negative refractive index material layer between two positive refractive index material layers, the divergence of the light beam is efficiently decreased. This means increase in the directionality of the light beam.

In the display device in the embodiment shown in FIG. 1, the negative refractive index functional layer 120 is arranged on the display unit 110. The negative refractive index functional layer 120 has a negative refractive index with respect to light from the display unit 110, so that light has decreased divergence after it passes through the negative refractive index functional layer 120. This increases the collimation degree of light, and improves the utilization efficiency of light in the display unit 110. This further improves the brightness of the display device 100 and reduces the power consumption. At the same time, since the negative refractive index functional layer 120 decreases divergence of light which is produced by the display unit 110, directionality of light improve. This facilitates improving peep proof performance of the display device 100. Moreover, due to the arrangement of the negative refractive index functional layer 120, it is not necessary to attach optical sheets such as BEF or DBEF on the display unit 110. This facilitates reducing the cost and thickness of the display device 100.

Figure 3:
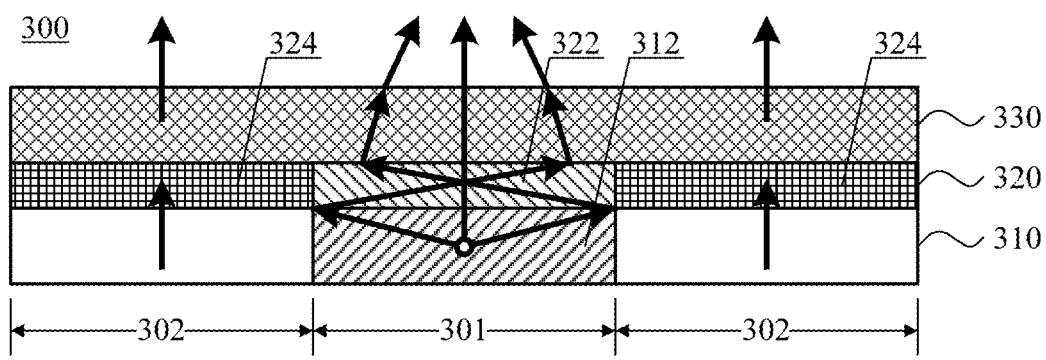
FIG. 3 is a structural view and light path for schematically illustrating a display device in an embodiment of the present disclosure.

FIG. 3 is a structural view for a display device in an embodiment of the present disclosure. As shown in FIG. 3, in an embodiment of the present disclosure, a display device 300 comprises a display region 301 and a light transmitting region 302. A display unit 310 for example is a liquid crystal display unit or an organic light emitting diode (OLED). By taking a liquid crystal display unit as an example, the display unit 310 comprises a backlight 312, and the backlight 312 is in the display region 301 of the display device 300. In the liquid crystal display unit shown in FIG. 3, the backlight 312 is arranged right below a display module 330, and is not arranged on an end face of the display unit. The backlight of a direct type facilitates realizing a display device 330 with increased area.

Arrows in FIG. 3 schematically illustrates the light path in the display device. In the display unit 310, the backlight 312 is in the display region 301, which provides light for the display region 301 of the display device 300, and realizes the information display function of the display device 300, as shown by arrows in the display region 301. The natural light passes through the light transmitting region 302 to realize the see-through function of the display device, as shown by arrows in the light transmitting region 302. Namely, the display device 300 in this embodiment is a transparent display device.

In an embodiment of the present disclosure, a negative refractive index functional layer 320 comprises a negative refractive index portion 322, and the negative refractive index portion 322 is in the display region 301 of the display device 300. In this embodiment, the negative refractive index portion 322 of the negative refractive index functional layer 320 is only in the display region 301. Thus, the negative refractive index functional layer 320 only has a collimation effect with respect to light from the backlight 312 of the display unit 310, and has no effect on the natural light in the light transmitting region 302. This facilitates realizing more realistic and natural transparent display function in the light transmitting region 302.

In an embodiment of the present disclosure, the negative refractive index functional layer 320 further comprises a transparent material portion 324, and the transparent material portion 324 is at least arranged in the light transmitting region 302 of the display device 300. The transparent material portion 324 is arranged in the light transmitting region 302. This ensures the penetrating performance of natural light in the light transmitting region 302, and does not affect the see-through function of the display device 300. The transparent material portion 324 is for example made from an inorganic or organic transparent material. The inorganic material comprises, but not limited to, silicon oxide, silicon nitride, silicon oxynitride. The organic material comprises, but not limited to, resin.

In an example, the negative refractive index functional layer 320 has a patterned structure, only comprises the negative refractive index portion 322 in the display region 301, and only comprises the transparent material portion 324 in the light transmitting region 302.

In another example, the transparent material portion 324 is arranged in both the display region 301 and the light transmitting region 302, and covers the negative refractive index portion 322 in the display region 301.

In an embodiment of the present disclosure, the display unit 310 is an organic light emitting diode (OLED). OLED is considered as a point light source, which has poor directionality of light. Generally, the backlight 312 comprises a plurality of OLEDs which are arranged in a two-dimensional array.

In an embodiment of the present disclosure, the negative refractive index portion 322 has a negative refractive index with respect to visible light. For example, the negative refractive index portion 322 has a negative refractive index with respect to light with a wavelength of 380-800 nm.

In an example, the OLED of the backlight 312 emits white light, or the light emitted by the OLED is converted by a phosphor into white light. In this case, the negative refractive index portion 322 has a negative refractive index with respect to visible light.

In another example, the OLED emits light of three primary colors, i.e., red, green and blue light. These light are then mixed to realize full-color display. In this case, the negative refractive index portion 322 has a negative refractive index with respect to red light, green light and blue light. It is noted that full-color display is not limited to RGB scheme in which light of three primary colors (i.e., red, green and blue) are involved. For example, CMYK scheme in which light of four primary colors (i.e., cyan, magenta, yellow and black) are involved can also be applied.

Examples of materials for the negative refractive index portion in embodiments of the present disclosure will be described hereinafter. It is noted that a material with a negative refractive index does not exist in the nature. In Pendry, Phys. Rev. Lett., 76, 4773-4776(1996), starting from the electromagnetic field Maxwell's equations and the constitutive equation, theoretical calculation indicates that a material with a negative refractive index can theoretically be formed. According to the theoretical concept of Pendry, in Smith et al., Phys. Rev. Lett., 84, 4184-4187(2000), a material with a negative refractive index is formed for the first time from a two-dimensional periodic structure comprising a split ring resonator (SRR) of metal stripes and conductive wires. In Enkrich et al., Phys. Rev. Lett., 95, 203901(2005), a material with a negative refractive index with respect to light with wavelength of 800 nm is formed from a two-dimensional periodic structure comprising metal strips and a metal split ring resonator. With the development and improvement in the technical conditions for processing and printing electric circuits, the plasma cutoff frequency of the metal wires array is expected to reduce gradually. This indicates that a material with a negative refractive index with respect to light of shorter wavelength will be available.

In Dolling et al., Optics Letters, Vol. 32, 53-55(2007), a layer of metal silver is deposited on a glass plate, a thin layer of non-conductive magnesium fluoride is formed to cover the metal silver, and another layer of metal silver is formed to cover the magnesium fluoride, to form a "sandwich" with a thickness of 100 nm. The sandwich structure is then etched to form an array of square holes. The resulting structure is a grid or mesh similar with a metal mesh. This nano-grid of a stack comprising a metal, a dielectric and a metal has a negative refractive index with respect to light with a wavelength of 780 nm.

In addition, in Wenshan Cai et al., Nature Photonics, Vol. 1 224-228(2007), a dielectric matrix and metal strips which are distributed radially in the dielectric matrix are used to form a material with a negative refractive index with respect to light with a wavelength of 632.8 nm.

Figure 4:
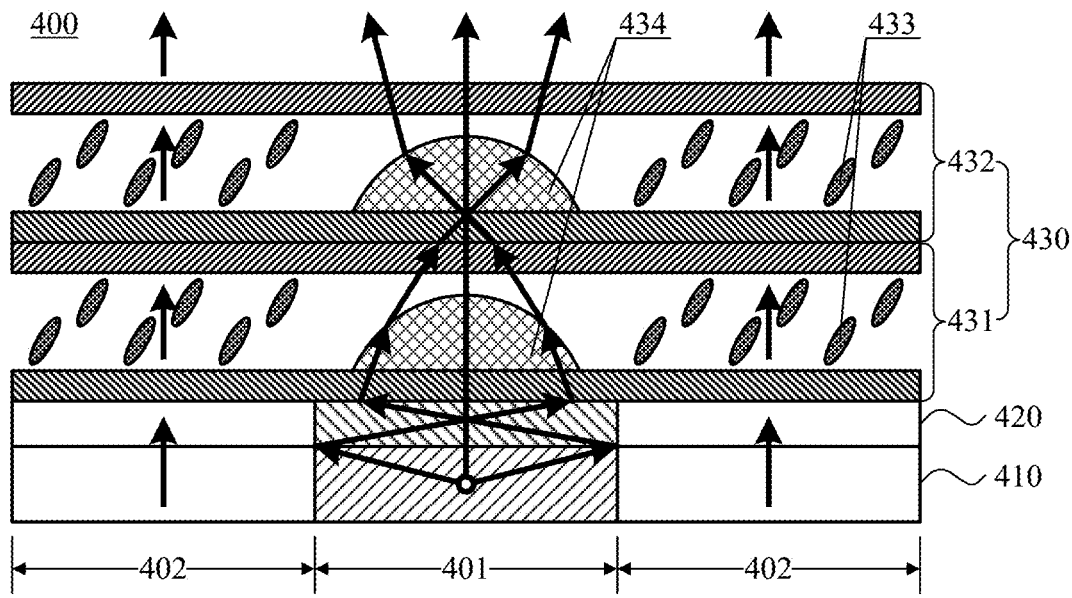
FIG. 4 is a structural view and light path for schematically illustrating a display device in an embodiment of the present disclosure.

FIG. 4 schematically shows a structural view and light path for a display device in an embodiment of the present disclosure. As shown in FIG. 4, a display device 400 comprises a display unit 410 and a negative refractive index functional layer 420 on the display unit 410. The display device 400 comprises a display region 401 and a light transmitting region 402. Hereinafter, emphasis is placed on the difference between the embodiment shown in FIG. 4 and the embodiments shown in FIGS. 1 and 3.

In the embodiment shown in FIG. 4, the display device 400 is a D-View device. As shown, the display device 400 comprises a light converging unit 430 which is arranged on the negative refractive index functional layer 420. As shown, the light converging unit 430 comprises two liquid crystal prism layers 431, 432 which are stacked in this order on the negative refractive index functional layer 420. During operation of the liquid crystal prism layers 431, 432, liquid crystal molecules 433 in each liquid crystal prism layer are deflected under the control of electrodes (not shown), so as to form a liquid crystal prism 434. For example, the liquid crystal prism layers 431, 432 are driven by an active switch like a thin film transistor. Different grayscale voltages are input to different stripe-shaped electrodes, so that the morphology of liquid crystal in respective regions is controlled, and the liquid crystal prism 434 is formed. In each of the liquid crystal prism layers 431, 432, the liquid crystal prism 434 is in the display region of the display device.

In FIG. 4, arrows in the display region 401 show a path of light which is produced by the display unit 410 and travels through the light converging unit 430. As shown, the liquid crystal prism 434 facilitates further improving the directionality of light emitted from the display unit 410. This is advantageous for improving the peep proof performance of the display device 400.

Figure 5:
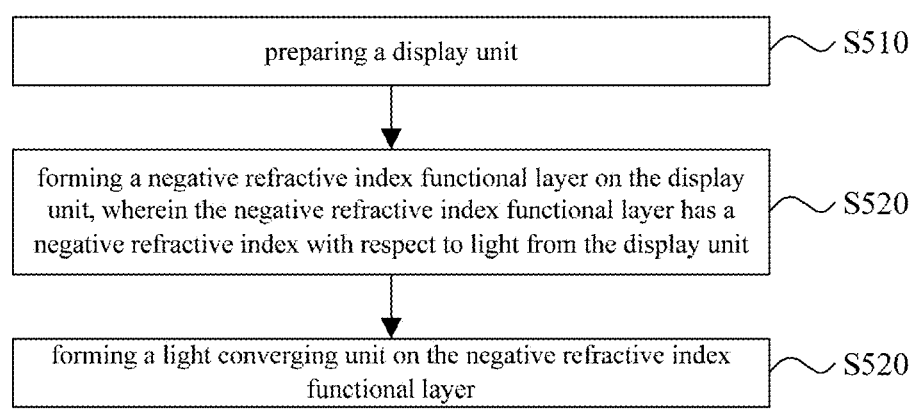
FIG. 5 is a flow chart for schematically illustrating a method for fabricating a display device in an embodiment of the present disclosure.

FIG. 5 schematically shows a flow chart for a method for fabricating a display device in an embodiment of the present disclosure. As shown, in an embodiment of the present disclosure, a method for fabricating a display device is provided, comprising: step S510: preparing a display unit; and step S520: forming a negative refractive index functional layer on the display unit, wherein the negative refractive index functional layer has a negative refractive index with respect to light from the display unit. Optionally, the method further comprises step S530: forming a light converging unit on the negative refractive index functional layer.

In an embodiment of the present disclosure, the display device comprises a display region and a light transmitting region, and step S510 of preparing a display unit comprises: forming a backlight in the display region of the display device.

In an embodiment of the present disclosure, step S520 of forming a negative refractive index functional layer on the display unit comprises: forming a negative refractive index portion in the display region of the display device.

In an embodiment of the present disclosure, step S520 of forming a negative refractive index functional layer on the display unit comprises: forming a transparent material portion at least in the light transmitting region of the display device.

In embodiments, a display device and a method for fabricating the same are provided. The display device comprises a display unit and a negative refractive index functional layer on the display unit. The negative refractive index functional layer has a negative refractive index with respect to light from the display unit. Light emitted from the display unit has decreased divergence and improved collimation degree after passing through the negative refractive index functional layer, so that the utilization efficiency of light in the display unit is improved. This improves brightness of the display device, and the power consumption of the display device at a same brightness is reduced. Since the directionality of the backlight is improved, the peep proof performance of the display device is improved. By replacing optical sheets such as BEF or DBEF with the negative refractive index functional layer, the cost and thickness of the display device is reduced.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A transparent display device, comprising:
   a display unit comprising a liquid crystal display unit or an organic light emitting diode;
   a negative refractive index functional layer on a light-emitting side of the display unit; and
   a light converging unit on the negative refractive index functional layer,
   wherein the negative refractive index functional layer has a negative refractive index with respect to light from the display unit,
   wherein the negative refractive index functional layer comprises a negative refractive index portion and a transparent material portion,
   wherein the transparent display device is divided into a display region and a light transmitting region,
   wherein the display unit is only in the display region,
   wherein the negative refractive index portion is only in the display region,
   wherein the transparent material portion is at least arranged in the light transmitting region,
   wherein the negative refractive index portion comprises a nano-grid of a stack comprising a first metal, a dielectric, and a second metal, each of the first and the second metals comprises silver, and the dielectric comprises magnesium fluoride, and
   wherein the light converging unit comprises two liquid crystal prism layers which are stacked on the negative refractive index functional layer and wherein each of the two liquid crystal prism layers comprises a liquid crystal prism in the display region.

2. The transparent display device of claim 1, wherein the transparent material portion is further in the display region.

3. The transparent display device of claim 1, wherein the negative refractive index portion has a negative refractive index with respect to visible light.

4. The transparent display device of claim 1, wherein the negative refractive index portion has a negative refractive index with respect to red light, green light and blue light.

5. The transparent display device of claim 1, wherein the negative refractive index portion comprises a two-dimensional periodic structure comprising metal strips and a metal split ring resonator.

6. The transparent display device of claim 1, wherein the negative refractive index portion comprises a dielectric matrix and metal strips which are distributed radially in the dielectric matrix.

7. A method for fabricating a transparent display device, comprising:
   preparing a display unit, the display unit comprising a liquid crystal display unit or an organic light emitting diode;
   forming a negative refractive index functional layer on a light-emitting side of the display unit, the negative refractive index functional layer having a negative refractive index with respect to light from the display unit, and the negative refractive index functional layer comprising a negative refractive index portion and a transparent material portion; and
   forming a light converging unit on the negative refractive index functional layer,
   wherein the transparent display device is divided into a display region and a light transmitting region, the display unit is only in the display region, the negative refractive index portion is only in the display region, and the transparent material portion is at least arranged in the light transmitting region,
   wherein the negative refractive index portion comprises a nano-grid of a stack comprising a first metal, a dielectric, and a second metal, each of the first and the second metals comprises silver, and the dielectric comprises magnesium fluoride, and
   wherein the light converging unit comprises two liquid crystal prism layers which are stacked on the negative refractive index functional layer and wherein each of the two liquid crystal prism layers comprises a liquid crystal prism in the display region.

* * * * *